United States Patent [19]

Bottman

[11] Patent Number: 5,578,917
[45] Date of Patent: Nov. 26, 1996

[54] REPETITIVE DIGITAL SAMPLING CIRCUIT USING TWO DELAY LINES FOR IMPROVED TIME ACCURACY

[75] Inventor: Jeffrey S. Bottman, Seattle, Wash.

[73] Assignee: Fluke Corporation, Everett, Wash.

[21] Appl. No.: 415,925

[22] Filed: Mar. 20, 1995

[51] Int. Cl.⁶ .................................................. G01R 23/16
[52] U.S. Cl. .......................................................... 324/76.15
[58] Field of Search .............................. 324/76.11, 76.13, 324/76.15, 76.24, 76.41, 76.42, 76.55, 76.58, 76.47

[56] References Cited

U.S. PATENT DOCUMENTS 3,800,221  3/1974  Hair ........................................ 324/76.47
5,291,140  3/1994  Wagner ................................... 324/76.24

Primary Examiner—Michael Tokar

[57] ABSTRACT

A digital sampling circuit is providing for repetitively launching a series of stimulus pulses into a network under test and digitally sampling the resulting response signal. Enhanced time base accuracy of the repetitive sample is obtained using a pulse delay line in series with the pulse generator and a sample delay line in series with sample-and-hold (S/H) circuit. By summing digital samples obtained for the same time delay but using unique combinations of pulse delay line and sample delay line whose absolute time errors are combined differentially, the absolute time delay error contributed by both delay lines appears as a constant systematic error for any selected point along the response signal, allowing for highly accurate time intervals between selected points. This architecture is used to obtain an equivalent sampling resolution of 2 nanoseconds because each of the delay lines has two nanosecond steps. The summing process of the dual delay line architecture allows off-the-shelf delay lines with absolute accuracy specified at ±1 nanosecond to be accommodated.

16 Claims, 3 Drawing Sheets

5,578,917

REPETITIVE DIGITAL SAMPLING CIRCUIT USING TWO DELAY LINES FOR IMPROVED TIME ACCURACY

BACKGROUND OF THE INVENTION

This invention relates generally to repetitive digital sampling circuits and in particular to method and apparatus for generating a repetitive digital sampling rate with improved time accuracy.

Digital sampling is a process by which analog signals may be convened to digital representations. The analog to digital converter (ADC) is a commercially-available device for digitizing signals. Used in test and measurement applications, the ADC may be used to digitize a complete waveform. The most basic method of digitizing a waveform involves converting the instantaneous voltage level of the signal present at the input of the ADC into a digital sample. A sample-and-hold circuit (S/H) may be employed ahead of the ADC to capture the instantaneous voltage value at a desired instant in time and hold the voltage value for the ADC to measure. Conventional digital circuitry, such as microprocessors and memory devices, can be used to receive the digital samples and store them collectively as a time record for later retrieval and reconstruction of the input signal.

In order to accurately reconstruct the input signal from the stored samples, the effective digital sample rate becomes a concern. Capturing a waveform involves sequentially sampling and storing the instantaneous voltage levels of the signal at a rate high enough to reconstruct the waveform from the stored digital samples. The minimum rate necessary to accomplish this is generally determined by the Nyquist rate, which is understood to equal two times the maximum bandwidth of the signal. As long as the ADC has the ability to sample fast enough to reconstruct a signal of interest, the process of digital sampling can be accomplished with real-time sampling. In real-time sampling, the ADC sequentially samples the input signal and the digital samples are then stored in corresponding memory locations. However, an ADC with an adequate real-time sample rate may not be available for higher frequency input signals.

The effective sample rate of ADC's has been extended so that higher frequency signals may be digitized using a process commonly referred to as repetitive digital sampling. The basic requirements for repetitive digital sampling are that the sampled signal be repetitive and that a stable starting point on the signal be known. For signals that meet this requirement, repetitive sampling may be employed to obtain an equivalent digital sampling rate many times higher than the real-time digital sampling rate by digitizing selected points of the signal over multiple periods. Repetitive digital sampling circuits employ sophisticated timing circuits which determine selected points on the signal at precisely calculated time intervals from the starting point of the repetitive signal. A number of samples at selected points on the signal are collected and placed in corresponding locations in a digital acquisition memory. A composite representation of the repetitive signal may then be constructed from the stored digital samples. The particular order in which particular portions of the signal are digitized is not critical. The time resolution of the reconstructed signal is a direct function of the time resolution of the timing circuits employed to determine the time delay.

Repetitive sampling techniques are employed in electronic test equipment such as digital storage oscilloscopes (DSO's) to obtain high equivalent sampling rates in a manner as previously described, often with time resolutions of one nanosecond or less. DSO's typically use timing circuits to generate a series of precisely timed sample pulses which are directed to a S/H circuit to capture a voltage level at a selected time delay from the starting point. The digital samples are placed in digital memory at locations corresponding to their time interval from the starting point at the sample rate governed by the ADC. The timebase circuit necessary to generate the sample pulses at the time interval accuracy needed tend to be expensive and complex because high speed clocks and digital counters operating at the equivalent sampling rate are required to keep track of the selected time delay.

Closely associated with the time resolution provided by a repetitive digital sampling circuit is its time interval accuracy in producing sampling pulses. Ideally, all collected digital samples occur at time intervals of equal spacing on the signal being measured. Time interval accuracy is of critical importance to the overall performance of electronic test equipment employing repetitive digital sampling because without the equal sample spacing in time, distortion and errors in the sampling process arise in the reconstruction of the sampled signal. Thus, digital sampling circuits that provide high time resolution sampling pulses must do so with substantially equal time interval spacing to be acceptable for use in electronic test equipment.

In an application for a portable, electronic test instrument in which a high frequency, repetitive signal is to be measured, the needs for low power consumption and low component cost and complexity necessitated another approach to implement a digital sampling circuit with a high equivalent sample rate and with a time interval accuracy level to support that sample rate. It would therefore be desirable to provide such a digital sampling circuit using relatively low cost, commercially-available electronic components.

SUMMARY OF THE INVENTION

In accordance with the present invention, a circuit for repetitively generating a stimulus signal and sampling the response signal using a pair of electronic delay lines to obtain high accuracy equivalent time sampling is provided. An equivalent time resolution of two nanoseconds is obtained which corresponds to a repetitive sampling rate of 500 megasamples per second.

A 62.5 megahertz clock provides a high accuracy pulse every 16 nanoseconds (ns) to provide a coarse time base increment. The delay lines each have selectable delay times from 0 to 14 nanoseconds in two nanosecond increments to provide a fine time base increment. One delay line is in series with the pulse trigger and other is in series with the sample trigger, and both delay lines are employed to provide the effective two nanosecond time resolution between each 16 nanosecond coarse time base increment. The pulse delay line delays the stimulus signal by the pulse delay time and the sample delay line delays the sample trigger by the sample delay time. The selected point on the response signal has a time delay from a known starting point to the desired sample point on the response signal. This time delay is determined by the coarse delay time (the number of 16 nanosecond clock pulses) offset by the fine delay time which equals the sampling delay time minus the pulse delay time.

The two delay lines are employed in a manner that the differences in the absolute time delay errors for each delay line are combined over multiple measurements for a selected point on the response signal. In this way, the system time delay error arising from the two delay lines is constant for every selected point on the sample waveform, providing the desired constant spacing between any adjacent pair of sample points. This design allows the use of low cost, commercially-available components with an absolute delay accuracy of ± one nanosecond for any delay setting. This time interval accuracy level by itself is not sufficient for use as a digital sampling circuit using a single delay line. The sampling points would not be evenly spaced in time, resulting in unacceptably high measurement errors.

In the two delay line architecture, the selected delay in one delay line is offset by the selected delay in the other delay line over multiple measurements, to obtain the same overall time delay from the starting point. For example, a selected point on the response signal of 6 nanoseconds from the starting point may be arrived at with selected combinations of delays of the two delay lines which may include +14 and −8, +12 and −6, +10 and −4, and so on. The positive and negative delays are possible because one delay line is in series with the stimulus signal and the other is series with the response signal. The relative delays in the two delay lines are thus added as vectors which offset each other to arrive at the desired delay time.

Over multiple digital samples with unique combinations of settings of the two delay lines, measurement errors resulting from the absolute errors in delay times across multiple delay settings are summed together, resulting in a more accurate composite sample at the selected point on the sampled signal. In a set of unique delay line combinations, a particular delay setting is used only once for each delay line. A time record consisting of a series of composite measurements stored in acquisition memory with two nanosecond time resolution can be obtained to reconstruct the sampled response signal. In the preferred embodiment, each composite sample is the sum of eight individual measurements taken with eight unique combinations of the two delay line settings to arrive at a more accurate selected time delay.

One object of the present invention is to provide a method of repetitive digital sampling with improved sample time accuracy and time resolution.

A further object of the present invention is to provide a method of repetitive digital sampling with high sample time accuracy and resolution using low cost components.

Another object of the present invention is to provide an apparatus for repetitively generating and digitally sampling signals using a pair of low cost delay lines to obtain improved time interval accuracy.

An additional object of the present invention is to provide a circuit for repetitively generating a stimulus pulse and repetitively sampling the resulting pulse response using a pair of delay lines where the time delays of the two delay lines are offset against each other and their absolute delay errors are summed over multiple measurements using unique time delay combinations to obtain improved time interval accuracy.

Other features, attainments, and advantages will become apparent to those skilled in the art upon a reading of the following description when taken in conjunction with the accompanying drawings.

DETAILED DESCRIPTION OF THE INVENTION

Repetitive digital sampling is a process in which a digital representation of a signal is assembled from digital samples at an equivalent digital sampling rate that may be much faster than the real-time sampling rate. Repetitive digital sampling requires that the signal being sampled be truly repetitive and that it have a known starting point. The present invention is a variation of repetitive digital sampling in which the stimulus pulse is repetitively generated by the sampling circuit and the resulting response signal thereby has a known starting point relative to the stimulus pulse. Because the stimulus and response signals have a dependent timing relationship, the digital sampling circuit according to the present invention takes advantage of the properties of programmable delay lines to shift the trigger and sample pulses forward and back in time with respect to each other. In this way, the time delay errors of each delay line may be combined over multiple measurements in such a way as to achieve a high time interval accuracy.

A single delay line may provide the desired level of time resolution with its series of selectable time delay steps but typically lacks the desired level of time interval accuracy needed for digital sampling applications. With two delay lines working in tandem, one in series with the pulse trigger and other in series with the sample trigger pulse, the effects of absolute time delay errors in each delay line can be combined over a number of measurements in order to obtain high time resolution digital sampling according to the time delay step size of the delay lines and with commensurate level of time interval accuracy to meet the needs of digital sampling applications. The two delay lines need not be matched in terms of absolute time delay accuracy, allowing the use of low cost, commercially available components in the manufacturing process.

Figure 1:
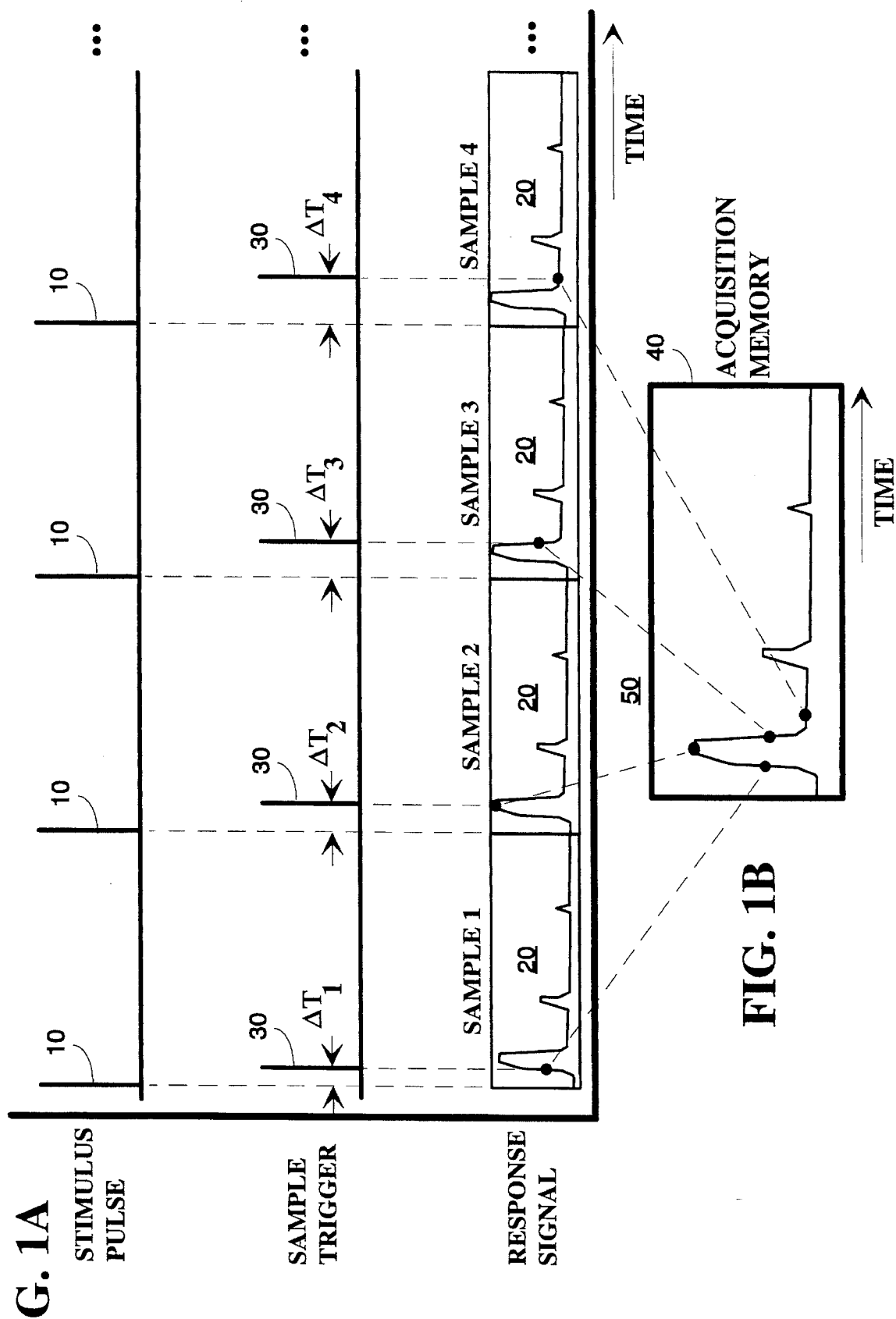
FIGS. 1A–1B together comprise a simplified timing diagram illustrating the overall process of repetitively generating stimulus pulses and repetitively sampling the input signal to obtain a digital representation of the input signal.

In FIG. 1A–B, there is shown a timing diagram that represents an overview of the process of repetitive digital sampling. The upper portion of the graph shown in FIG. 1A shows the repetitive generation of the stimulus pulses 10 which are generated at regular intervals. These intervals are typically at the real-time sampling rate which is substantially slower than the equivalent sampling rate that may be achieved. For each stimulus pulse 10 that is generated, a response signal 20 is returned from a device under test (not shown) that represents the pulse response of the device under test. Because the response signal 20 is dependent on the stimulus pulse 10, the starting point of the response signal 20 is thereby known. Over each period of the response signal 20, a digital sample is taken, starting with SAMPLE1 and continuing. A sample trigger pulse 30 appears at selected points on the response signal 20 as defined by the time delays ΔT1–ΔT4 from the starting point of the response signal 20 as shown.

As each digital sample is measured, the digital sample is stored in a memory location in an acquisition memory 40 shown in FIG. 1B corresponding to a selected point on the response signal 20 as shown by arrows 50. It will be noted that the order in which the digital samples are collected and placed into the acquisition memory 40 may be random or sequential. Furthermore, multiple samples at selected delay times may also be collected during a single response signal 20 if the real-time sample rate is adequate. A digital sampling circuit for obtaining sufficient time resolution of the delay time ΔT from the starting point which corresponds to the desired point on the response signal 20 according to the present invention is explained below in detail.

Figure 2:
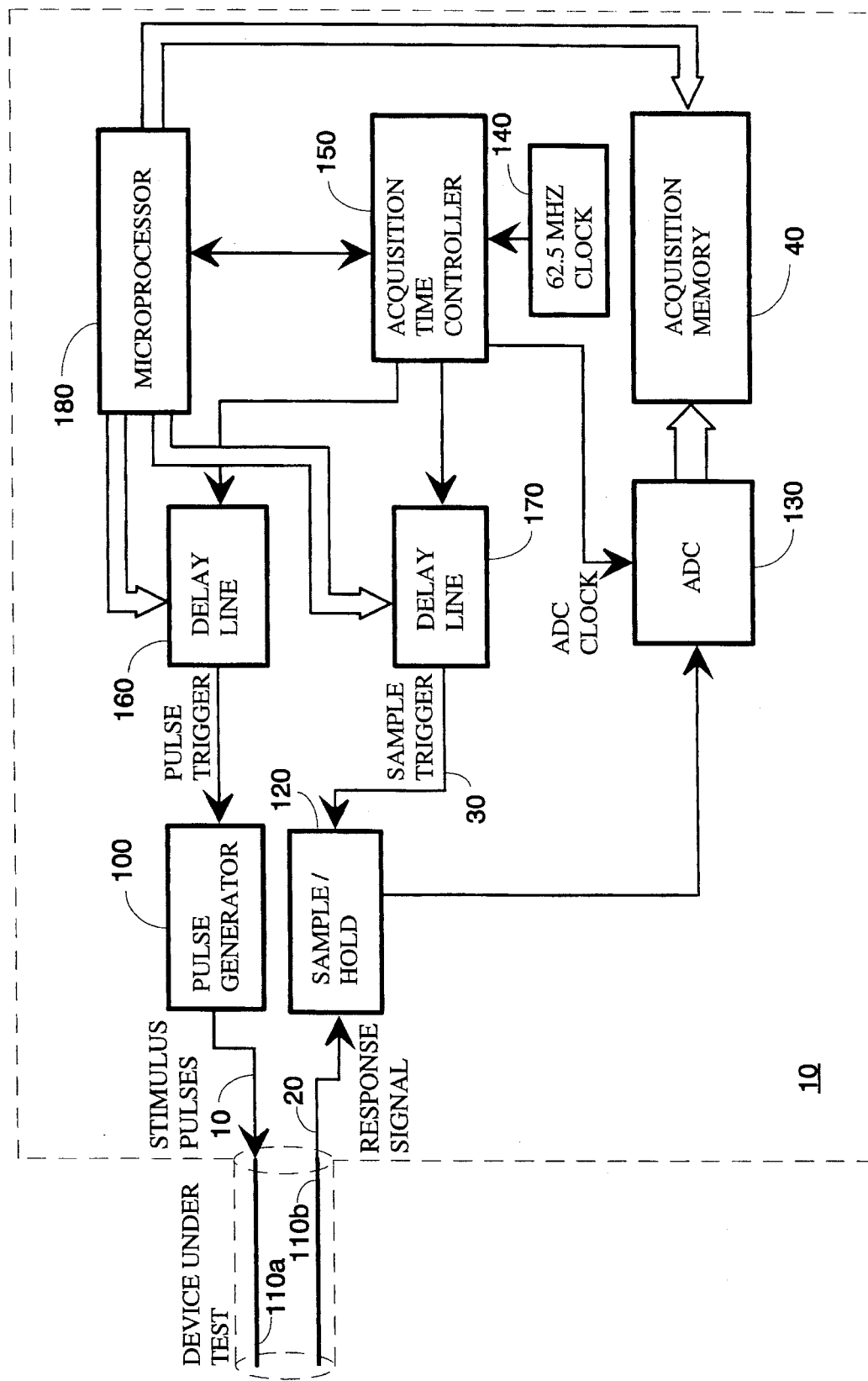
FIG. 2 is a simplified block diagram illustrating the digital sampling circuit according to the preferred embodiment of the present invention.

FIG. 2 is a simplified block diagram of a digital sampling circuit 10 according to present invention. An output of a pulse generator 100 is coupled to a transmission line 110a and an input of a sample/hold (S/H) circuit 120 is coupled to a transmission line 110b. The transmission lines 110a and 110b may form a pair of parallel transmission lines such as the types found in local area network (LAN) cables for carrying data traffic. It will be noted that any representative one-port or two-port device under test that would benefit from stimulus and response testing with high time resolution may be coupled to the instrument 10. The stimulus pulse 10 and response signal 20 may be applied to either a generic one-port device under test, such as a single transmission line 110a, for operation similar to that of a time domain reflectometer, or to a two-port device under test, such as the pair of transmission lines 110a and 110b as shown, to test cross-talk response. The transmission lines 110a and 110b will be used as the device under test for purposes of example and illustration.

The pulse generator 100 produces a stimulus pulse 10 that propagates down the transmission line 110a and the response signal 20 induced in the transmission line 110b is received at an input of the S/H circuit 120. S/H 120 captures the instantaneous voltage level of the response signal 20 present at its input responsive to a sample trigger received at a sample input. An output of the S/H 120 is coupled to an input of an analog-to-digital converter (ADC) 130 that receives the voltage level held by the S/H 120 and converts it to a digital sample on receipt of an ADC clock signal received at a control input. The digital sample is coupled to the acquisition memory 40 (shown in FIG. 1) that is used to store the digital sample. A 62.5 MHz clock 140 provides a stable clock signal with a period of 16 nanoseconds to an ACQUISITION TIME CONTROLLER (ATC) 150 which in turn provides the critical timing signals of the circuit 10 in the proper sequence. The clock 140 serves as a source of coarse time base delay with a resolution of 16 nanoseconds for the coarse time base increment. A pulse delay line 160 is disposed in series between an output of the ATC 150 and the pulse generator 100 for providing a selectable amount of delay to the pulse trigger signal. A sample delay line 170 is disposed in series between an output of the ATC 150 and the S/H 120 for providing a selectable amount of delay to the sample trigger signal. The ATC 150 further provides the ADC clock signal to the ADC 130 and the microprocessor 180 provides address information to the acquisition memory 40 for the coordinated placement of the digital samples arriving from the ADC 130 corresponding to selected time delay values. A microprocessor 180 is coupled to a control input of the delay line 160 and a control input of the delay line 170 to selectively control the delay of the pulse trigger and sample trigger signals. The microprocessor 180 is further coupled to the ATC 150 so that the various combinations of delay settings of the pulse delay line 160 and sample delay line 170 may be coordinated with the control signals generated by the ATC 150.

By repetitively launching a stimulus pulse into the transmission line 110a and digitally sampling selected points of the response signal 20 using the S/H 120 and ADC 130, a digital representation of the response signal 20 is assembled in the acquisition memory 40. The microprocessor 180 and ATC 150 coordinate the process of repetitive digital sampling. The process of using the delay lines 160 and 170 to achieve improved time interval resolution of 2 nanoseconds over that of the coarse delay time resolution of 16 nanoseconds is shown in FIG. 3.

Figure 3:
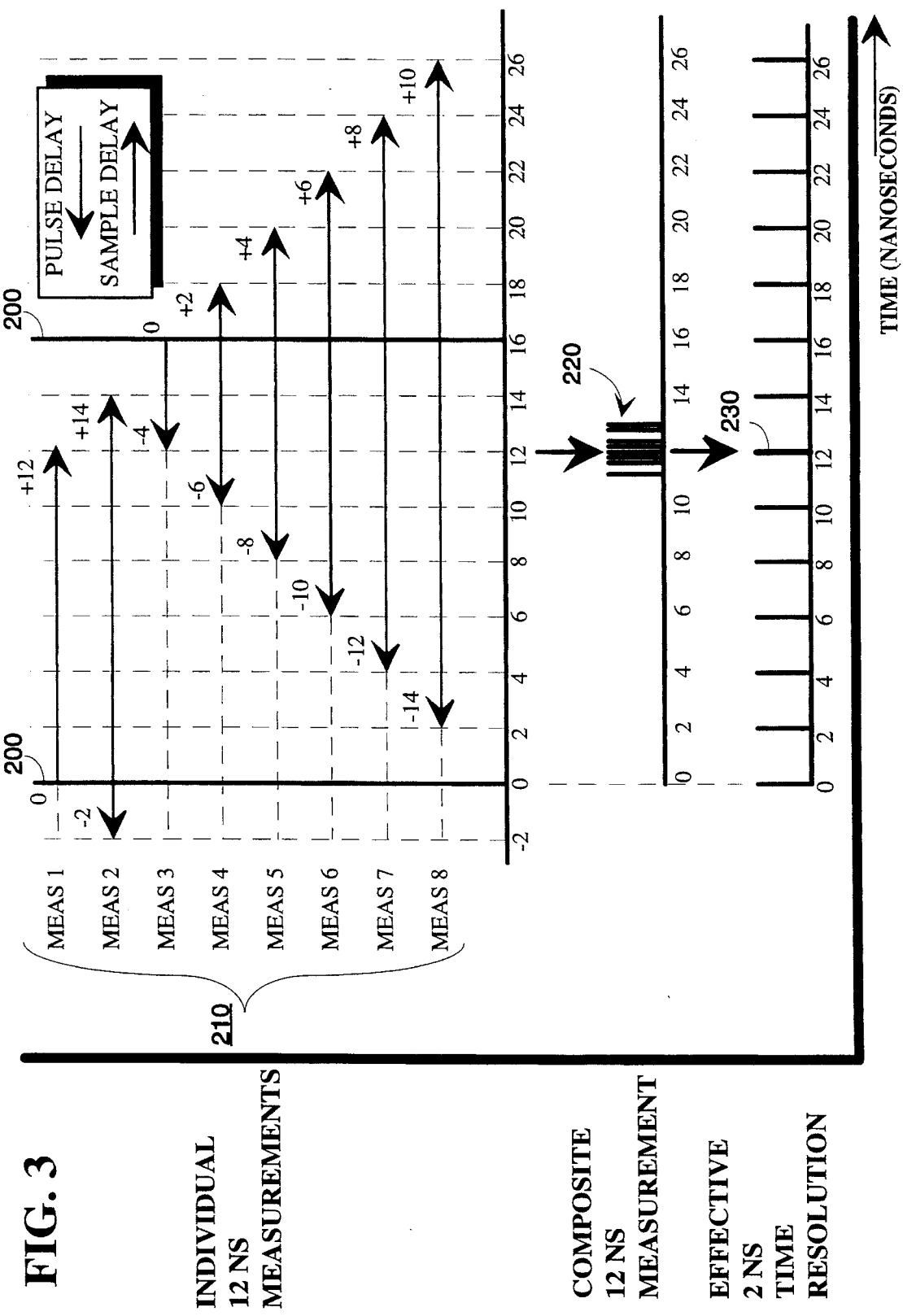
FIG. 3 is a timing diagram illustrating the process of obtaining improved time interval accuracy according to the block diagram of FIG. 2 using multiple measurements with unique combinations of delay settings of the two delay lines according to the preferred embodiment of the present invention.

In FIG. 3, there is shown a timing diagram which provides an example of how a selected point along the response signal 20 may be digitally sampled with improved time accuracy. Every 16 nanoseconds, a coarse time base delay pulse 200 is provided by the clock 140 (shown in FIG. 2) representing the course delay time resolution of 16 nanoseconds. The total coarse time base delay is determined by counting a predetermined number of 16 nanosecond clock cycles. The course time base thus has a coarse time base delay resolution of 16 nanoseconds.

In the FIG. 3, only the first two clock cycles of the coarse delay as represented by the pulses 200 are shown for simplicity of illustration. The ATC 150 may select a coarse time base delay from the beginning of the response signal with 16 nanosecond resolution by counting the number of pulses 200 that occur after pulse trigger. The pulse delay line 160 can be programmed to delay the pulse trigger signal from 0 to 14 nanoseconds in 2 nanosecond steps. Similarly, the sample delay line 170 can be programmed to delay the sample trigger signal from 0 to 14 nanoseconds in 2 nanosecond steps. As such, the delay lines 160 and 170 together provide 2 nanosecond fine time delay resolution between the 16 nanosecond coarse time delay resolution pulses. The fine time base delay resolution is related to the coarse time base delay resolution by the number of available delay steps of the delay lines 160 and 170, according to the following formula.

$$\text{Fine Time Base Delay Resolution} = [\text{Come Time Base Delay Resolution}/n]$$

The variable n is the number of available delay line steps for each delay line. In the preferred embodiment, each delay line 160 and 170 has eight steps with a coarse time base delay resolution of 16 nanoseconds to provide the related two nanosecond fine time base delay resolution. The delay lines 160 and 170 must each have the two nanosecond steps but they need not be matched in terms of actual delay time accuracy, thus simplifying manufacturing processes and allowing commercially-available delay lines to be used.

Enhanced accuracy of the 2 nanosecond steps is achieved by summing together eight measurements by the ADC 130 taken with eight unique combinations of the delay settings of the delay lines 160 and 170. In a set of unique delay line combinations, a particular delay setting is used only once for each of the delay lines 160 and 170. The delays of the two delay lines offset each other and a set of unique combinations of the two delay lines are chosen to sample the same selected point on the response signal 20. The sum of the sample data over multiple measurements corresponding to the selected point is the composite sample. By obtaining multiple samples over a set of unique delay settings of the delay lines 160 and 170, the absolute errors encountered over any particular delay setting in either delay line are summed with other delay line settings so that the time difference to neighboring sample points is substantially close to 2 nanoseconds for any given selected point on the response signal 20. The process of handling the absolute delay errors from the delay lines 160 and 170 to obtained the desired level of time interval accuracy is explained in further detail below.

The graph of FIG. 3 illustrates the process for obtaining a composite sample of the selected point on the response signal 20 corresponding to 12 nanoseconds. Eight separate measurements labeled INDIVIDUAL 12 NS MEASUREMENTS are shown as a group 210 which are performed using eight unique combinations of the delay line settings of the delay lines 160 and 170 to obtain a composite sample corresponding to a desired point of 12 nanoseconds on the response signal 20. For each selected point, each delay setting for each delay line is used only once in the group 210. The delay time corresponding to the selected point is the coarse time base delay plus the sample delay time minus the pulse delay time. MEAS 1, the first measurement, is performed with the pulse delay line 160 (shown in FIG. 2) set for 0 nanosecond delay, the sample delay line 170 set for 12 nanosecond delay, and the coarse time base delay set for 0 nanosecond delay. The digital sample from MEAS 1 is then stored in the acquisition memory 40. MEAS 2 is performed with the pulse delay line 160 set for 2 nanosecond delay, the sample delay line 170 set for 14 nanosecond delay, and with a coarse time base delay set for 0 nanosecond delay. The sample times for MEAS 1 and MEAS 2, including the absolute delay errors $\epsilon s$ and $\epsilon p$ from delay lines 170 and 160 respectively are as follows:

MEAS 1: 0*16 ns+12 ns sample delay −0 ns pulse delay +$\epsilon s$(12)−$\epsilon p$(0)

MEAS 2: 0*16 ns+14 ns sample delay −2 ns pulse delay +$\epsilon s$(14)−$\epsilon p$(2)

$\epsilon s$(12) and $\epsilon s$(14) are the absolute delay errors for the delay line 170 for the selected delays of 12 ns and 14 ns respectively. $\epsilon p$(0) and $\epsilon p$(2) are the absolute delay errors for the delay line 160 for the selected delays of 0 ns and 2 ns respectively. The remaining measurements MEAS 3 through 8 of the group 210 are performed in a similar manner.

The middle trace labeled COMPOSITE 12 NS MEASUREMENT shows a possible distribution of actual time delay values labeled 220 that may occur around the target 12 nanosecond delay time of the eight measurements of the group 210. The shape of the distribution illustrates the differences that may be encountered between the absolute delay of sample delay line 170 minus the absolute delay of the pulse delay line 160 for the group 210 of measurements using the eight unique delay line combinations shown. The composite sample 230 is calculated as the sum of eight digital sample values collected and the composite measurement value is then stored in the memory location in the acquisition memory 40 corresponding to the selected point of 12 nanoseconds. Composite samples for other time delays are collected in similar manner.

The order in which digital samples are collected and in which the composite samples are then calculated from the digital samples may be varied according to the needs of efficiency and the limitations of available acquisition memory size. In the preferred embodiment of the present invention, MEAS 1 through MEAS 8 of the group 210 are sequentially summed into a single acquisition memory location corresponding to each selected point. This solution requires an acquisition memory 40 that is no larger than the collected waveform.

In an alternative embodiment of the present invention, the digital samples from MEAS 1 through MEAS 8 are collected for all of the time delay values along the response signal 20 and stored in the acquisition memory 40. The digital samples for each corresponding time delay are then summed and placed in the appropriate memory locations corresponding to the time delay in the acquisition memory 40. This arrangement requires an acquisition memory size substantially larger than the preferred embodiment but may be desirable for overall measurement speed. Alternatively, the process of averaging the individual digital samples may be done as each set of digital samples corresponding to a selected point on the response waveform are collected. Less acquisition memory is required but possibly at the cost of measurement speed because the selected delay times of the delay lines 160 and 170 would have to be changed more often.

The bottom trace labeled EFFECTIVE 2 NS TIME RESOLUTION illustrates the corresponding memory locations in the acquisition memory 40 in which the composite samples are ultimately stored. The effective time resolution of the sampled response signal is 2 nanoseconds because the sampled response signal is comprised of composite samples spaced every 2 nanoseconds. The composite sample 230 for the selected point of 12 nanoseconds as measured and calculated above is stored in a corresponding memory location in the acquisition memory 40. Composite samples for other selected points along the response signal 40 are calculated in a similar manner. A more detailed explanation of the process of summing the group 210 of measurements for each composite sample to obtain the effective 2 nanosecond time resolution follows.

The method of obtaining the desired level of time interval accuracy is accomplished with the use of the differential time delay errors between the delay lines 160 and 170. The delay lines 160 and 170 (shown in FIG. 2) each have actual delay times that deviate from the selected delay time, resulting in absolute time delay errors. For purposes of illustration, the following Table 1 provides the absolute delay errors $\epsilon s$ and $\epsilon p$ for two representative, exemplary delay lines, labeled S for the sample trigger delay line 160 and P for the pulse trigger delay line 170, over each of the eight selected time delays.

TABLE 1

Absolute Delay Error of Two Typical Delay Lines

| Delay Line Setting (ns) | Absolute Error (ns) | |
| --- | --- | --- |
| | $\epsilon_S$ | $\epsilon_P$ |
| 0  | 0   | 0.4 |
| 2  | 0.1 | 0.3 |
| 4  | 0.2 | 0.2 |
| 6  | 0.3 | 0.1 |
| 8  | 0.4 | 0   |
| 10 | 0.5 | 0.3 |
| 12 | 0.6 | 0.6 |
| 14 | 0.7 | 0.5 |
| Σ  | 2.8 | 2.4 |

Systematic Error 0.4 ns

The absolute errors $\epsilon s$ and $\epsilon p$ shown in the Table 1 are representative of the absolute errors that may be encountered in delay lines available commercially with an absolute accuracy specification of ±1 nanosecond (ns) for any given delay setting. No predetermined matching or selection of a given delay line is required. If the total delay error for each delay line of Table 1 is calculated and the difference taken, the result is an absolute system error of 0.4 nanoseconds for the combination of the two representative delay lines chosen above. This absolute system error is essentially constant over any given moment in time.

The group 210 of measurements is collected as shown in FIG. 3 for each of the unique delay combinations of the delay lines 160 and 170. The differential errors ($\epsilon_S - \epsilon_P$) between the two delay lines are calculated according to the following Table 2.

TABLE 2

Differential Error for a Set of Unique Delay Line Combinations

| Delay Line Settings (ns) | | Differential Error (ns) |
|---|---|---|
| S | P | $\epsilon_S - \epsilon_P$ |
| 12 | 0 | 0.2 |
| 14 | 2 | 0.4 |
| 0 | 4 | −0.2 |
| 2 | 6 | 0 |
| 4 | 8 | 0.2 |
| 6 | 10 | 0.0 |
| 8 | 12 | −0.2 |
| 10 | 14 | 0 |
| Σ | | 0.4 |

Systematic Error 0.4 ns

For example, the first line of the Table 2, with the sample trigger delay line 170 set for 12 nanoseconds and the pulse trigger delay line 160 set for 0 nanoseconds, corresponds to MEAS 1 as shown in FIG. 3. The differential error ($\epsilon_S - \epsilon_P$) between the delay Lines S and P as shown is 0.2 nanoseconds using the data from Table 1. The set of differential errors ($\epsilon_S - \epsilon_P$) for each of the group 210 of measurements is then shown graphically (not to scale) as the distribution 220 which has a total systematic error of 0.4 nanoseconds.

The composite sample 230 corresponding to 12 nanoseconds thus has an average time delay of 12.4 nanoseconds due to systematic error. As long as unique combinations of S and P are chosen such that any particular setting of S and P is only used once in a group 210 of measurements, the system error for any composite sample is identical. Thus, the composite sample 230 corresponding to 10 nanoseconds has an average delay of 10.4 nanoseconds using a group 210 measurements based on a corresponding combination of unique delay line settings. Likewise, the composite sample 230 corresponding to 14 nanoseconds has an average delay of 14.4 nanoseconds based on a corresponding combination of unique delay line settings. Between any two neighboring pairs of composite measurements, such as for the selected points of 10 nanoseconds and 12 nanoseconds, the combinations of delay line settings used in the respective group 210 of measurements for each composite measurement will differ but the resulting systematic delay error is identical, thereby providing the effective two nanosecond time resolution with high accuracy.

The systematic error remains constant across each of the unique combinations of the delay line settings for different selected points because of the commonly understood distributive and commutative mathematical properties which can be expressed by the following set of simplified equations:

$$
\begin{aligned}
(S1 + S2 + S3) - (P1 + P2 + P3) &= (S1 - P1) + (S2 - P2) + (S3 - P3) & \text{(i)} \\
&= (S1 - P2) + (S2 - P3) + (S3 - P1) & \text{(ii)} \\
&= (S1 - P3) + (S2 - P1) + (S3 - P2) & \text{(iii)}
\end{aligned}
$$

The left side of the equation represents the systematic delay error between two hypothetical delay lines S and P, each with three delay settings 1, 2 and 3. This is the systematic delay error according to Table 1. The right side of the equation shows the three unique combinations (i, ii, and iii) that maintain the constant systematic delay error for the three unique combinations. This is the same systematic delay error as calculated in Table 2. In the preferred embodiment of the present invention, delay lines with eight delay settings are used to obtain eight unique combinations to obtain two nanosecond steps of the fine time base that span the gap between the 16 nanosecond coarse time base pulses. Greater or few combinations may be obtained with the appropriate type of delay line to obtain the desired level time resolution.

It will be noted that the digital sample data from the group 210 of measurements are summed to obtain the composite measurement value. The accuracy improvement is based on the assumption that the sample data values are distributed linearly as a function of the differential error ($\epsilon_S - \epsilon_P$). From empirical test results, this assumption has been validated in the preferred embodiment.

It will be obvious to those having ordinary skill in the art that many changes may be made in the details of the above described preferred embodiments of the invention without departing from the spirit of the invention in its broader aspects. For example, the delay lines 160 and 170 may have greater or fewer delay settings depending on the desired number of measurements to be summed. The time resolution may be increased by choosing delay lines with a finer step size. The order in which measurements are calculated and averaged to obtain a composite measurement may be varied to optimize measurement throughput rates. Therefore, the scope of the present invention should be determined by the following claims.

What I claim as my invention is:

1. A digital sampling circuit, comprising:

(a) pulse generator means responsive to a pulse trigger signal for launching a stimulus signal into a device under test;

(b) sampling means responsive to a sample trigger signal for providing digital samples of a response signal received from said device under test;

(c) a first delay line coupled to said pulse generator means for delaying said pulse trigger signal by a pulse delay time;

(d) a second delay line coupled to said sampling means for delaying said sample trigger signal by a sample delay time; and (e) an acquisition time controller circuit for generating said pulse trigger signal and said sample trigger signal wherein said sampling means generates a plurality of digital samples corresponding to a selected point on said response signal, each digital sample is determined by a unique combination of said pulse delay time and said sample delay time, and a composite sample corresponding to said selected point is calculated from a sum of said plurality of digital samples.

2. A digital sampling circuit of claim 1 further comprising an acquisition memory for receiving said composite sample and storing said composite sample in a memory location corresponding to said selected point.

3. A digital sampling circuit of claim 2 wherein a plurality of composite samples values are collected and placed in said acquisition memory at locations corresponding to said selected points.

4. A digital sampling circuit of claim 1 further comprising a clock oscillator coupled to said acquisition time controller wherein said selected point is further determined by a course time base delay wherein said selected point is the sum of a coarse time base delay plus said sample delay time minus said pulse delay time and said course time delay is comprised of a selected number of clock cycles of said clock oscillator.

5. A digital sampling circuit of claim 4 wherein a fine time base delay resolution is equal to said coarse time base resolution of said course time base delay divided by a predetermined number of available delay steps of said first and second delay lines.

6. A digital sampling circuit of claim 1 wherein said fast and second delay lines comprise programmable delay lines with selectable delay times and having a step size of two nanoseconds.

7. A digital sampling circuit of claim 1 wherein said stimulus signal comprises a square pulse and said response signal comprises a pulse response.

8. A digital sampling circuit of claim 1 wherein said device under test comprises a two terminal device wherein said stimulus pulse is coupled to a terminal and said response signal is received from another terminal.

9. A digital sampling circuit of claim 1 wherein said device under test comprises a one terminal device wherein said stimulus pulse is coupled to a terminal and said response signal is received from said terminal.

10. A digital sampling circuit, comprising:
   (a) pulse generator means responsive to a pulse trigger signal for launching a stimulus signal into one of a pair of transmission lines;
   (b) sampling means responsive to a sample trigger signal for digitally sampling a response signal received from another of said pair of transmission lines;
   (e) a first delay line coupled to said pulse generator means for delaying said pulse trigger signal by a pulse delay time;
   (d) a second delay line coupled to said sampling means for delaying said sample trigger signal by a sample delay time;
   (e) an acquisition time controller circuit for generating said pulse trigger signal and said sample trigger signal wherein said sampling means generates a plurality of digital samples corresponding to a selected point on said response signal, each digital sample is determined by a unique combination of said pulse delay time and said sample delay time, and a composite sample corresponding to said selected point is calculated from the sum of said plurality of digital samples; and
   (f) an acquisition memory for receiving said composite sample and storing said composite sample in a memory location corresponding to said selected point wherein a plurality of composite samples values are collected and placed in said acquisition memory at locations corresponding to said selected points.

11. A digital sampling circuit of claim 10 further comprising a clock oscillator coupled to said acquisition time controller wherein said selected point is further determined by a course time base delay wherein said selected point is the sum of a coarse time base delay plus said sample delay time minus said pulse delay time and said course time delay is comprised of a selected number of clock cycles of said clock oscillator.

12. A digital sampling circuit of claim 11 wherein a free time base delay resolution is equal to said coarse time base resolution of said course time base delay divided by a predetermined number of available delay steps of said first and second delay lines.

13. A digital sampling circuit of claim 10 wherein said first and second delay lines comprise programmable delay lines with selectable delay times and having a step size of two nanoseconds.

14. A digital sampling circuit of claim 10 wherein said stimulus signal comprises a square pulse and said response signal comprises a pulse response.

15. In a digital sampling circuit, a method for repetitive digital sampling, comprising:
   (a) launching a stimulus pulse into a device under test responsive to a pulse trigger signal;
   (b) generating said pulse trigger signal followed by said sample trigger signal;
   (c) selectively delaying said sample trigger signal by a sample delay time; and
   (d) selectively delaying said pulse trigger signal by a pulse delay time,
   (e) digitally sampling a response signal received from said device under test responsive to a sample trigger signal at a selected point on said response signal, said selected point determined by the sum of a coarse time base delay minus said pulse delay time plus said sample delay time; and
   (f) calculating a composite sample corresponding to said selected point as the sum of a plurality of said digital samples each corresponding to said selected point and determined from a unique combination of said pulse delay time and said sample delay time.

16. A method for repetitive digital sampling of claim 15 further comprising:
   (a) calculating said composite sample corresponding to a plurality of selected points on said response signal; and
   (b) storing said composite sample in an acquisition memory in locations corresponding to said plurality of selected points.

* * * * *